(12) United States Patent
Wu et al.

(10) Patent No.: US 12,360,364 B2
(45) Date of Patent: Jul. 15, 2025

(54) HEAD UP DISPLAY SYSTEM

(71) Applicants: Beijing BOE Optoelectronics Technology Co., Ltd., Beijing (CN); BOE Technology Group Co., Ltd., Beijing (CN)

(72) Inventors: Yulong Wu, Beijing (CN); Chenru Wang, Beijing (CN); Ke Li, Beijing (CN); Jiarong Bai, Beijing (CN); Na Han, Beijing (CN); Ruijun Dong, Beijing (CN); Lili Chen, Beijing (CN); Yufan Du, Beijing (CN); Tengfei Chen, Beijing (CN); Hao Zhang, Beijing (CN); Zhenhuan Tian, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 249 days.

(21) Appl. No.: 17/921,317

(22) PCT Filed: May 12, 2021

(86) PCT No.: PCT/CN2021/093441
§ 371 (c)(1),
(2) Date: Oct. 25, 2022

(87) PCT Pub. No.: WO2022/001400
PCT Pub. Date: Jan. 6, 2022

(65) Prior Publication Data
US 2023/0176372 A1 Jun. 8, 2023

(30) Foreign Application Priority Data
Jun. 29, 2020 (CN) .......................... 202010607197.0

(51) Int. Cl.
*G02B 27/01* (2006.01)
*G02B 3/04* (2006.01)
(Continued)

(52) U.S. Cl.
CPC ............... *G02B 27/01* (2013.01); *G02B 3/04* (2013.01); *G02B 5/08* (2013.01); *G02B 7/003* (2013.01);
(Continued)

(58) Field of Classification Search
CPC . G02B 27/01; G02B 3/04; G02B 5/08; G02B 7/003; G02B 15/1421;
(Continued)

(56) References Cited

U.S. PATENT DOCUMENTS

2009/0005961 A1 1/2009 Grabowski et al.
2019/0011712 A1* 1/2019 Nagano .................... G09G 5/38
(Continued)

FOREIGN PATENT DOCUMENTS

CN 106950696 A 7/2017
CN 206615076 U 11/2017
(Continued)

OTHER PUBLICATIONS

PCT/CN2021/093441 international search report.
CN 202010607197.0 first office action dated Mar. 12, 2025.

*Primary Examiner* — Pinping Sun
*Assistant Examiner* — Matthew Y Lee
(74) *Attorney, Agent, or Firm* — IPro, PLLC

(57) ABSTRACT

A head up display system, including: a display screen used for displaying an image; an imaging lens arranged on a light exit side of the display screen and used for imaging an image displayed on the display screen; and a curved reflecting mirror arranged on the side of the imaging lens facing away from the display screen and used for receiving imaging light (Continued)

of the imaging lens and reflecting said light to the position where human eyes are located. Relative positions of the display screen and the imaging lens are fixed, and the imaging lens and the curved reflecting mirror adopt a separate structure.

14 Claims, 3 Drawing Sheets

(51) Int. Cl.
  *G02B 5/08* (2006.01)
  *G02B 7/00* (2021.01)
  *G02B 15/14* (2006.01)
  *G02F 1/13* (2006.01)
  *G03B 21/56* (2006.01)
  *H10K 59/10* (2023.01)
  *G02B 3/00* (2006.01)

(52) U.S. Cl.
  CPC ........... *G02B 15/1421* (2019.08); *G02F 1/13* (2013.01); *G03B 21/56* (2013.01); *H10K 59/10* (2023.02); *G02B 2003/0093* (2013.01)

(58) Field of Classification Search
  CPC ...... G02B 2003/0093; G02B 2027/011; G02B 2027/013; G02B 27/0101; G02B 13/00; G02B 27/0012; G02F 1/13; G03B 21/56; H10K 59/10
  See application file for complete search history.

(56) References Cited

U.S. PATENT DOCUMENTS

| | | | |
|---|---|---|---|
| 2019/0033586 A1 | 1/2019 | Miyato et al. | |
| 2019/0129172 A1* | 5/2019 | Misawa | H05K 7/2039 |
| 2019/0265468 A1* | 8/2019 | Hirata | B60K 35/215 |
| 2021/0349312 A1* | 11/2021 | Hirata | G02B 1/18 |
| 2021/0395073 A1* | 12/2021 | Fujishima | G02B 26/105 |

FOREIGN PATENT DOCUMENTS

| | | |
|---|---|---|
| CN | 107462988 A | 12/2017 |
| CN | 108431668 A | 8/2018 |
| CN | 109477968 A | 3/2019 |
| CN | 109901297 A | 6/2019 |
| CN | 111596460 A | 8/2020 |
| JP | 2009122582 A | 6/2009 |
| TW | 201000948 A | 1/2010 |

\* cited by examiner

HEAD UP DISPLAY SYSTEM

CROSS REFERENCE TO RELATED APPLICATIONS

The present application is a national phase entry under 35 U.S.C § 371 of International Application No. PCT/CN2021/093441, filed May 12, 2021, which claims the priority to Chinese Patent Application No. 202010607197.0, filed to the China National Intellectual Property Administration on Jun. 29, 2020 and entitled "HEAD UP DISPLAY SYSTEM", which is incorporated herein by reference in its entirety.

FIELD

The present disclosure relates to the technical field of display, and in particular to a head up display system.

BACKGROUND

A head up display (HUD for short), also called a parallel display system, can project important driving information such as speeds and navigation onto a windshield before a driver, allowing the driver to see the important driving information without bowing or turning his/her head.

HUD usually projects important driving information onto the windscreen according to the principle of optical reflection. Through the HUD, the driver can easily combine the outside scene with the information displayed by the HUD.

Being integrally-formed in structure and large-sized as a whole, an existing head-up display system occupies a great volume after a driving seat is mounted and cannot be adjusted according to the actual situation.

SUMMARY

Embodiments of the present disclosure provide a head up display system. The head up display system includes:
 a display screen used for displaying an image;
 an imaging lens arranged on a light emitting side of the display screen and used for imaging an image displayed on the display screen;
 a curved reflector arranged on a side of the imaging lens facing away from the display screen and used for receiving imaging light from the imaging lens and reflecting the light to positions of human eyes;
 relative positions of the display screen and the imaging lens are fixed, and the imaging lens and the curved reflector adopt a split structure.

In some embodiments of the present disclosure, a focal length of an optical system composed of the imaging lens and the curved reflector is 190 mm to 200 mm;
 a focal length of the imaging lens is greater than three times of the focal length of the optical system; and
 a focal length of the curved reflector is greater than two times of the focal length of the optical system.

In some embodiments of the present disclosure, a distance between the display screen and the imaging lens is 4 mm to 5 mm, and a distance between the imaging lens and the curved reflector is 150 mm to 170 mm.

In some embodiments of the present disclosure, the display screen is one of an organic light-emitting diode display screen, a micro organic light-emitting diode display screen, a liquid crystal display, a digital light processing projection system or a liquid crystal on silicon display screen.

In some embodiments of the present disclosure, the imaging lens includes at least one lens.

In some embodiments of the present disclosure, lenses in the imaging lens are coaxially arranged.

In some embodiments of the present disclosure, the lens is a spherical lens, an aspherical lens or a free-form lens.

In some embodiments of the present disclosure, the imaging lens includes:
 a first lens arranged on the light emitting side of the display screen; and
 a second lens arranged on a side of the first lens facing away from the display screen;
 the first lens being a positive lens and the second lens being a negative lens.

In some embodiments of the present disclosure, the first lens and the second lens are spherical lenses; and two optical surfaces of the first lens and two optical surfaces of the second lens each satisfies a following relation:

$$z = \frac{cr^2}{1 + \sqrt{1 - (1+k)c^2 r^2}};$$

where z represents a surface equation of the optical surface, c represents a radius of curvature, k represents a conic coefficient, and r represents a semiaperture.

In some embodiments of the present disclosure, an optical surface on a side of the first lens close to the display screen satisfies:
 k=0, and
 c=3.939848223043368×10$^2$; and
 an optical surface on a side of the first lens facing away from the display screen satisfies:
 k=0, and
 c=−6.967912313673151×10.

In some embodiments of the present disclosure, an optical surface on a side of the second lens close to the first lens satisfies:
 k=0, and
 c=−4.096120177593520×10; and
 an optical surface on a side of the second lens facing away from the first lens satisfies:
 k=0, and
 c=−5.861444795965758×10.

In some embodiments of the present disclosure, the curved reflector is a spherical mirror, an aspherical mirror or a free-form mirror.

In some embodiments of the present disclosure, the curved reflector is the free-form mirror, two optical surfaces of the curved reflector are parallel to each other, and the two optical surfaces of the curved reflector each satisfies a following relation:

$$z = \frac{cr^2}{1 + \sqrt{1 - (1+k)c^2 r^2}} + \sum_{i=1}^{N} A_i E_i(x, y);$$

where z represents a surface equation of the optical surface, c represents a radius of curvature, k represents a conic coefficient, r represents a semiaperture, $E_i(x,y)$ represents an extended polynomial, $A_i$ represents a coefficient of the extended polynomial, and N represents a total number of the coefficients of the polynomial.

In some embodiments of the present disclosure, the optical surface of the curved reflector satisfies:
k=−3.724720760726326×10, and
c=−6.710907082649701×10$^2$; and
coefficients corresponding to the extended polynomial in the surface equation that the optical surface of the curved reflector satisfies are:
a coefficient of a first term being 38, a coefficient of a second term being 134, a coefficient of a third term being 0, a coefficient of a fourth term being 0, a coefficient of a fifth term being −4.452481, a coefficient of a sixth term being 0, a coefficient of a seventh term being −2.902843, a coefficient of an eighth term being 0, a coefficient of a ninth term being 0.680583, a coefficient of a tenth term being 0, a coefficient of an eleventh term being 0.594765, a coefficient of a twelfth term being −13.143795, a coefficient of a thirteenth term being 0, a coefficient of a fourteenth term being −30.083025, a coefficient of a fifteenth term being 0, a coefficient of a sixteenth term being −13.251191, a coefficient of a seventeenth term being 0, a coefficient of an eighteenth term being 3.982513, a coefficient of a nineteenth term being 0, a coefficient of a twentieth term being 9.501150, a coefficient of a twenty-first term being 0, a coefficient of a twenty-second term being 8.733155, a coefficient of a twenty-third term being 5.925483, a coefficient of a twenty-fourth term being 0, a coefficient of a twenty-fifth term being 38.674995, a coefficient of a twenty-sixth term being 0, a coefficient of a twenty-seventh term being 34.654924, a coefficient of a twenty-eighth term being 0, a coefficient of a twenty-ninth term being 12.215770, a coefficient of a thirtieth term being 0, a coefficient of a thirty-first term being −5.009061, a coefficient of a thirty-second term being 0, a coefficient of a thirty-third term being −28.937871, a coefficient of a thirty-fourth term being 0, a coefficient of a thirty-fifth term being −46.733028, a coefficient of a thirty-sixth term being 0, a coefficient of a thirty-seventh term being −28.994059, a coefficient of a thirty-eighth term being −6.498547, a coefficient of a thirty-ninth term being 0 and a coefficient of a fortieth term being −35.932363.

In some embodiments of the present disclosure, an included angle between a tangent plane of a center point of the curved reflector and a vertical direction is adjustable, and the included angle of the curved reflector is 7°-11°.

BRIEF DESCRIPTION OF THE DRAWINGS

In order to describe technical solutions in embodiments of the present disclosure more clearly, accompanying drawings required for describing the embodiments of the present disclosure are briefly described below. Apparently, the accompanying drawings in the following description show merely some embodiments of the present disclosure, and a person of ordinary skill in the art would also be able to derive other accompanying drawings from these accompanying drawings without creative efforts.

DETAILED DESCRIPTION OF THE EMBODIMENTS

Figure 1:
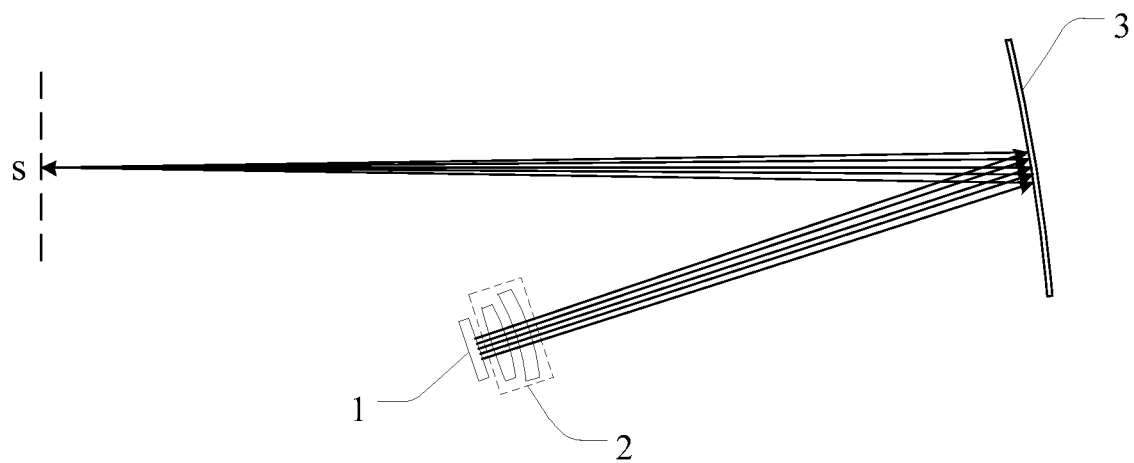
FIG. 1 is a schematic structural diagram of a head up display system provided in an embodiment of the present disclosure.

To make the foregoing objective, features, and advantages of the present disclosure clearer and more comprehensible, the present disclosure will be further described in detail below in conjunction with accompanying drawings and embodiments. However, the illustrative implementation modes may be implemented in many forms and should not be construed as limitation to the implementation modes set forth herein; rather, these implementation modes are provided so that the present application will be more thorough and complete, and will fully convey the concept of the illustrative implementation modes to those skilled in the art. The same reference numerals in the drawings denote the identical or similar structures, and thus repeated descriptions thereof will be omitted. The words expressing positions and directions described in the present disclosure are all illustrated by taking the accompanying drawings as examples, but can also be changed according to needs, and all the changes are included in the scope of protection of the present disclosure. The accompanying drawings of the present disclosure are merely for the purpose of illustrating relative positional relations and are not intended to represent true proportions.

A head up display technology is often used in the fields of vehicles and aviation. A head up display system is designed to allow a driver to keep a head-up attitude all the time without looking down at displays and data of an instrument, and reduce delay and discomfort caused by ignorance of rapid changes of external environment after head down and before head up and required constant adjustment of eye focal length. Information projected by the head up display system is essential to driving safety, and may be changed according to different situations.

FIG. 1 is a schematic structural diagram of a head up display system provided in the embodiments of the present disclosure.

As shown in FIG. 1, the head up display system provided in the embodiments of the present disclosure includes a display screen 1, an imaging lens 2 and a curved reflector 3.

The display screen 1 is used for displaying an image. In the head up display system, the display screen 1 is used for displaying driving-related information. For example, when the head up display system is applied to the field of vehicle driving, the display screen may display information such as road conditions, environment, vehicle speeds and engine operation state. When the head up display system is applied to the field of aviation, the display screen may display information such as flight altitudes, flight speeds, flight directions, vertical rate changes and banking angles.

In the embodiments of the present disclosure, the display screen 1 may use one of an organic light-emitting diode display screen, a micro organic light-emitting diode display screen, a liquid crystal display, a digital light processing projection system or a liquid crystal on silicon display screen.

The organic light-emitting diode (OLED) display screen is also called an organic electroluminescence display and an organic light-emitting semiconductor display. The OLED display screen is a current-type organic light-emitting device, which emits light through injection and recombination of carriers, and has a luminous intensity directly proportional to injected currents. Under the action of an electric field, holes generated by anodes of the OLED and electrons generated by cathodes will move to be injected into a hole transport layer and an electron transport layer respectively, and migrate to a luminescent layer. When meeting in the luminescent layer, the holes and the electrons generate energy excitons, which excite luminescent molecules to finally generate visible light. The OLED display screen is a self-illuminating display screen, does not need to be equipped with a backlight module, and has a small overall thickness, which is conducive to miniaturization of the head up display system and more conducive to mounting of the whole machine.

A micro OLED display screen is to miniaturize a light-emitting unit of OLED, and thus may allow more pixels to be set within a limited size and improve resolution of the display screen.

The liquid crystal display (LCD) is mainly composed of a backlight module and an LCD panel. The LCD panel itself does not emit light, and needs to implement brightness display relying on light sources provided by the backlight module. According to an imaging principle, the LCD is used to cause an electric field effect of liquid crystal molecule twisting under driving of an electric field between two electrodes by placing liquid crystal between two pieces of conductive glass, so as to control a transmission or shielding function of backlight, and further to display images. If a color filter is added, a color image may be displayed. The LCD technology is mature, and the LCD has low cost and excellent performance.

A digital light processing (DLP) projection system is a display technology for digital optical processing by using a digital micromirror device (DMD) as a main key processing element. For the DMD, a matrix composed of micromirrors is arranged on a semiconductor chip, and each micromirror controls one pixel in a projected image. The number of micromirrors is adaptive to resolution of the projected image. Under control of digital driving signals, these micromirrors may quickly change angles, thus reflecting light to a set position. Images of the DLP projection system are beautifully and delicately colored, natural and realistic. The DLP system also has high reliability and high image resolution.

An LCOS display screen is a matrix liquid crystal display device with a very small size based on a reflection mode. The LCOS display screen uses a complementary metal-oxide-semiconductor transistor (CMOS) integrated circuit chip coated with liquid crystal on silicon as the substrate of a reflective LCD. A CMOS substrate is formed by using an aluminum-plated reflector, and then the CMOS substrate is bonded with a glass substrate containing transparent electrodes, and liquid crystal is injected for packaging. The LCOS puts a control circuit behind the display device, so as to improve light transmittance, and achieve larger light outputs and higher resolution.

The display screen in the embodiments of the present disclosure may use any kind described above, and is not limited herein. In the head up display system, only simple information related to driving needs to be displayed for the driver, so the above display screen 1 may use a monochrome display unit. For example, color of emergent light of the display screen may be green, thereby improving display brightness. In order to optimize displays, the above display screen 1 may also be a full color display screen, which is not limited herein.

An optical system composed of an imaging lens 2 and a curved reflector 3 is arranged on a light emitting side of the display screen 1. The display screen 1 has a size about 0.7 inch, and displays a small image. The optical system is used to magnify a displayed image of the display screen 1 and reflects the image to positions where human eyes are located.

In the embodiments of the present disclosure, the display screen 1 has the size about 0.7 inch, and an image imaged by the optical system has a size about 5 inch, which is more suitable for human to watch. The driver may clearly see details displayed by the display screen 1 through the head up display system of the embodiments of the present disclosure.

The imaging lens 2 of the optical system above is arranged on the light emitting side of the display screen 1 and is used for imaging the image displayed on the display screen. In the head up display system provided in the embodiments of the present disclosure, the display screen 1 and the imaging lens 2 are arranged coaxially, which may reduce design difficulty and assembly accuracy and make the imaging lens 2 have a desirable imaging effect for the display screen 1.

During actual implementation, the imaging lens 2 may also magnify the displayed image of the display screen 1 to a certain extent. According to imaging requirements from the head up display system, at least one lens may be arranged to constitute the imaging lens 2. The lenses in the imaging lens 2 are arranged coaxially, so as to achieve simple design and easier assembly.

The curved reflector 3 is arranged on a side, of the imaging lens 2 facing away from the display screen 1 and is used for receiving imaging light of the imaging lens 2 and reflecting the imaging light to positions s of human eyes. The curved reflector 3 not only has a function of reflecting light rays, but is also used for amplifying the received imaging light, so as to reflect an image of the image displaying on the display screen 1 to the positions s of the human eyes, and the image has an appropriate size, and is more suitable for human to watch.

The head up display system provided in the embodiments of the present disclosure utilizes a principle of optical reflection to reflect an image of important driving-related information to the positions of human eyes. Therefore, a height of the image viewed by the driver is roughly flush with eyes of the driver, and a projected image is adjusted to an infinite distance of a focal length. When looking forward through the head up display system, the driver may easily combine external scenes with the information displayed by the head up display system.

The above head up display system provided in the embodiments of the present disclosure may further flexibly adjust contrast. For example, when external ambient light is strong, the display brightness of the display screen 1 may be improved, such that the head up display system has high image contrast. When the external ambient light is weak, the display brightness of the display screen 1 may be adaptively reduced, and power consumption may be reduced while the high contrast of the head up display system is guaranteed.

In addition, the above head up display system provided in the embodiments of the present disclosure may also automatically adjust the brightness according to a temperature of the whole machine. For example, when the temperature of the whole machine is higher than a preset temperature, the display brightness of the display screen 1 may be appropriately reduced, thus avoiding reduction of a service life of the head up display system due to a high temperature for a long time of the whole machine.

In the embodiments of the present disclosure, relative positions of the display screen 1 and the imaging lens 2 are fixed, and the imaging lens 2 and the curved reflector 3 adopt a split structure. The imaging lens 2 and the curved reflector 3 adopt the split structure, such that the curved reflector has a high degree of freedom. The curved reflector 3 in the embodiments of the present disclosure may rotate in a horizontal direction and rotate and move in a vertical direction. By adjusting a rotation angle of the curved reflector 3, an imaging position may be adjusted, such that the head up display system may be applied to use scenes where vehicles vary in type and drivers vary in height, and has more flexible applicability.

In the embodiments of the present disclosure, an included angle between a tangent plane of a center point of the curved reflector 3 and a vertical direction is adjustable, and the included angle of the curved reflector 3 is 7° to 11°. Therefore, the included angle of the curved reflector 3 may be adjusted according to actual use situation so as to make the head up display system more suitable for actual use scenes.

According to a position of the driver and a relative position between the head up display system and the driver, focal lengths of the imaging lens 2, the curved reflector 3 and the optical system composed of the imaging lens and the curved reflector are designed. In the embodiments of the present disclosure, the focal length of the optical system composed of the imaging lens 2 and the curved reflector 3 is 190 mm to 200 mm, the focal length of the imaging lens 2 is greater than three times of the focal length of the optical system, and the focal length of the curved reflector 3 is greater than two times of the focal length of the optical system.

The focal length of the optical system is determined jointly by factors such as an imaging distance, a distance between the human eyes and the curved reflector 3, a distance between the curved reflector 3 and a lens assembly unit 2, and imaging image quality. The embodiments of the present disclosure controls, with consideration of the various factors above, the focal length of the imaging lens 2, the curved reflector 3 and the optical system composed of the imaging lens and the curved reflector within the above range, and has a desirable imaging effect.

The positions of the display screen 1 and the imaging lens 2 are relatively fixed, and the distance between the display screen 1 and the imaging lens 2 is 4 mm to 5 mm. The imaging lens 2 and the curved reflector 3 adopt the split structure, and the distance between the imaging lens 2 and the curved reflector 3 is 150 mm to 170 mm.

The imaging lens 2 in the embodiments of the present disclosure is composed of at least one lens, and the lens included in the imaging lens 2 may be a spherical lens, an aspherical lens or a free-form lens. The spherical lens has the advantages of simple design and low assembly accuracy. However, the aspherical lens and the free-form lens have relatively small thicknesses, which may optimize the image quality, and the thicknesses may be selected according to actual requirements during optical design.

Figure 2:
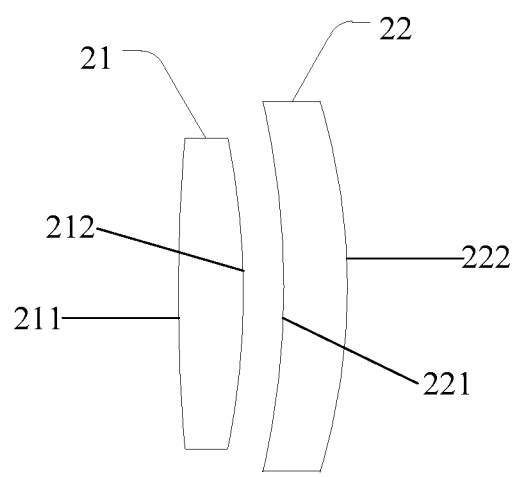
FIG. 2 is a schematic structural diagram of an imaging lens provided in an embodiment of the present disclosure.

FIG. 2 is a schematic structural diagram of an imaging lens provided in the embodiments of the present disclosure.

As shown in FIG. 2, in the embodiments of the present disclosure, the imaging lens includes a first lens 21 and a second lens 22 which are sequentially arranged in an emergent direction of a light. The first lens 21 is arranged on the light emitting side of the display screen 1, and the second lens 22 is arranged on a side of the first lens 21 facing away from the display screen 1. The first lens 21 is a positive lens and the second lens 22 is a negative lens.

The display screen 1, the first lens 21 and the second lens 22 are coaxially designed, which may simplify optical design and reduce accuracy required for assembly.

The first lens 21 has an optical surface 211 close to the display screen 1 and an optical surface 212 facing away from the display screen 1. The second lens has an optical surface 221 close to the first lens 21 and an optical surface 222 facing away from the first lens 21.

In the embodiments of the present disclosure, the first lens 21 and the second lens 22 are spherical lenses, thus reducing design difficulty of the imaging lens 2 and assembly difficulty of the imaging lens 2.

Two optical surfaces 211 and 212 of the first lens 21 and two optical surfaces 221 and 222 of the second lens 22 each satisfies the following relation:

$$z = \frac{cr^2}{1 + \sqrt{1 - (1+k)c^2r^2}};$$

where z represents a surface equation of the optical surface, c represents a radius of curvature, k represents a conic coefficient, and r represents a semiaperture.

When the first lens 21 and the second lens are the spherical mirrors, k is set to 0, the two optical surfaces 211 and 212 of the first lens 21, and the two optical surfaces 221 and 222 of the second lens 22 have radii of curvature set to values as shown in the following table.

| Optical surface | c |
| --- | --- |
| 211 | $3.939848223043368 \times 10^2$ |
| 212 | $-6.967912313673151 \times 10$ |
| 221 | $-4.096120177593520 \times 10$ |
| 222 | $-5.861444795965758 \times 10$ |

A distance between the optical surface 211 of the first lens 21 and the display screen 1 is 4 mm to 5 mm, a distance between the optical surface 211 and the optical surface 212 of the first lens 21 is 3 mm to 4 mm, a distance between the optical surface 212 of the first lens and the optical surface 221 of the second lens is 3 mm to 4 mm, a distance between the optical surface 221 and the optical surface 222 of the second lens is 3.5 mm to 4.5 mm, and a distance between the optical surface 222 of the second lens 22 and the curved reflector 3 is 150 mm to 170 mm.

Further, the curved reflector 3 in the embodiments of the present disclosure may be the spherical mirror, the aspherical mirror or the free-form mirror. The spherical lens has the advantages of simple design and low assembly accuracy. However, the aspherical lens and the free-form lens have relatively small thicknesses, which may optimize the image quality, and the thicknesses may be selected according to actual requirements during optical design.

Figure 3:
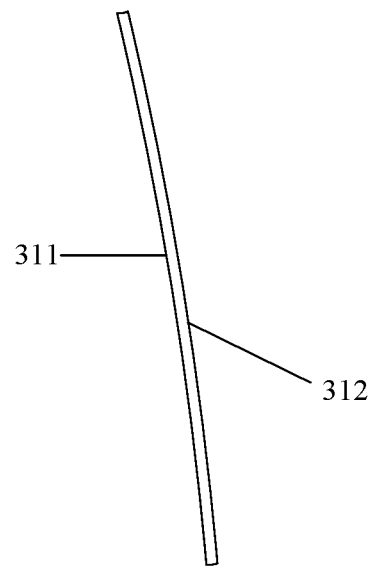
FIG. 3 is a schematic structural diagram of a curved reflector provided in an embodiment of the present disclosure.

FIG. 3 is a schematic structural diagram of a curved reflector provided in the embodiments of the present disclosure.

As shown in FIG. 3, in the embodiments of the present disclosure, the curved reflector 3 includes an optical surface 311 facing the second lens 22 and an optical surface 312 facing away from the second lens 22. The two optical surfaces 311 and 312 of the curved reflector 3 are parallel to each other and separated by a set distance.

In the embodiments of the present disclosure, the curved reflector 3 is the free-form mirror, the free-form mirror has higher design flexibility and may improve aberration of the optical system and optimize the imaging effect of the optical system.

The two optical surfaces 311 and 312 of the curved reflector each satisfies the following relation:

$$z = \frac{cr^2}{1+\sqrt{1-(1+k)c^2r^2}} + \sum_{i=1}^{N} A_i E_i(x, y);$$

where z represents a surface equation of the optical surface, c represents a radius of curvature, k represents a conic coefficient, r represents a semiaperture, $E_i(x,y)$ represents an extended polynomial, $A_i$ represents a coefficient of the extended polynomial, and N represents a total number of the coefficients of the polynomial.

In the embodiments of the present disclosure, k and c of the two optical surfaces 311 and 312 of the curved reflector 3 are set to:

k=−3.724720760726326×10, and c=−6.710907082649701×10².

The embodiments of the present disclosure adopt a surface in the form of a free-form surface of the extended polynomial, where additional data in the extended polynomial surface are defined in the following table.

| Serial No. of the additional data | Description |
| --- | --- |
| 1 | Serial No. of a maximum term |
| 2 | Normalized radius |
| 3, 4 | x, y |
| 5-7 | $x^2$, x, $y^2$ |
| 8-11 | $x^3$, $x^2y$, $xy^2$, $y^3$ |
| 12-16 | $x^4$, $x^3y$, $x^2y^2$, $xy^3$, $y^4$ |
| 17-22 | $x^5$, $x^4y$, $x^3y^2$, $x^2y^3$, $xy^4$, $y^5$ |
| 23-29 | $x^6$, $x^5y$, $x^4y^2$, $x^3y^3$, $x^2y^4$, $xy^5$, $y^6$ |
| 30-37 | $x^7$, $x^6y$, $x^5y^2$, $x^4y^3$, $x^3y^4$, $x^2y^5$, $xy^6$, $y^7$ |
| 38-46 | $x^8$, $x^7y$, $x^6y^2$, $x^5y^3$, $x^4y^4$, $x^3y^5$, $x^2y^6$, $x^1y^7$, $y^8$ |
| 47-56 | $x^9$, $x^8y$, $x^7y^2$, $x^6y^3$, $x^5y^4$, $x^4y^5$, $x^3y^6$, $x^2y^7$, $xy^8$, $y^9$ |
| 57-67 | $x^{10}$, $x^9y$, $x^8y^2$, $x^7y^3$, $x^6y^4$, $x^5y^5$, $x^4y^6$, $x^3y^7$, $x^2y^8$, $xy^9$, $y^{10}$ |
| Greater than 68 | Not used |

An expansion form of the extended polynomial is shown in the above table.

The number of terms used by the extended polynomial needs to be designed according to actual imaging requirements. Usually, the number of terms of the polynomial may be set in an increased manner. When the imaging quality after parameter optimization may not satisfy the requirements, the number of polynomials is appropriately increased until the final imaging quality satisfies the actual requirements.

In the embodiments of the present disclosure, the curved reflector 3 adopts a surface in the form of the free-form surface of the extended polynomial, and the extended polynomial adopts 40 terms. According to the order of the serial numbers, coefficients corresponding to expanded terms are shown in the following table.

| Serial No. | Coefficient |
| --- | --- |
| 1 | 38 |
| 2 | 134 |
| 3 | 0 |
| 4 | 0 |
| 5 | −4.452481 |
| 6 | 0 |
| 7 | −2.902843 |
| 8 | 0 |
| 9 | 0.680583 |
| 10 | 0 |
| 11 | 0.594765 |
| 12 | −13.143795 |
| 13 | 0 |
| 14 | −30.083025 |
| 15 | 0 |
| 16 | −13.251191 |
| 17 | 0 |
| 18 | 3.982513 |
| 19 | 0 |
| 20 | 9.501150 |
| 21 | 0 |
| 22 | 8.733155 |
| 23 | 5.925483 |
| 24 | 0 |
| 25 | 38.674995 |
| 26 | 0 |
| 27 | 34.654924 |
| 28 | 0 |
| 29 | 12.215770 |
| 30 | 0 |
| 31 | −5.009061 |
| 32 | 0 |
| 33 | −28.937871 |
| 34 | 0 |
| 35 | −46.733028 |
| 36 | 0 |
| 37 | −28.994059 |
| 38 | −6.498547 |
| 39 | 0 |
| 40 | −35.932363 |

In the embodiments of the present disclosure, the imaging lens 2 is the spherical mirror, and the curved reflector 3 is the free-form mirror. By optimizing the above parameters, the head up display system structure satisfying the imaging requirements may be obtained.

The embodiments of the present disclosure further perform distortion simulation on the head up display system.

Figure 4:
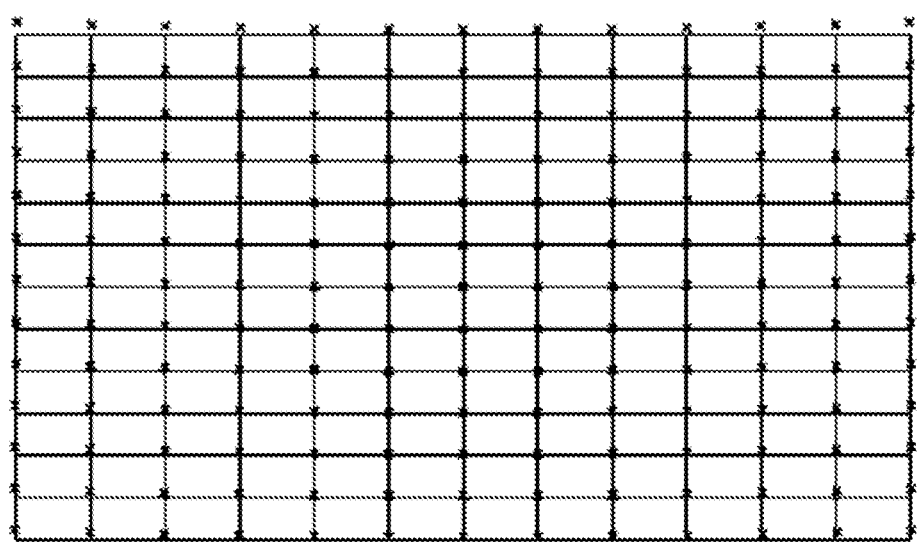
FIG. 4 is a mesh distortion diagram of a head up display system provided in an embodiment of the present disclosure.

FIG. 4 is a mesh distortion diagram of a head up display system provided in an embodiments of the present disclosure, where "x" represents a real imaging point and "." represents an ideal imaging point. It may be seen from FIG. 4 that after the parameters of the head up display system provided in the embodiments of the present disclosure are optimized, a position difference between the real imaging point and the ideal imaging point is small, mesh distortion is less than 3%, a distortion magnitude is small, and a desirable imaging effect is achieved.

Figure 5:
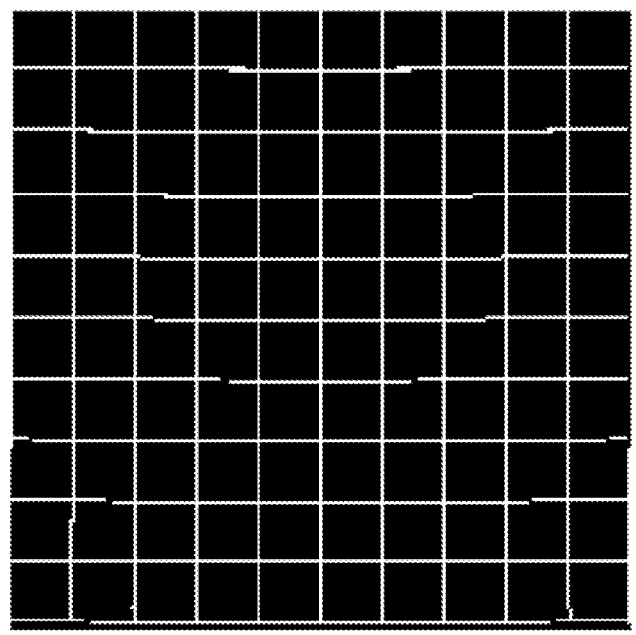
FIG. 5 is an actual mesh diagram of a head up display system provided in an embodiment of the present disclosure.

FIG. 5 is an actual mesh diagram of a head up display system provided in the embodiments of the present disclosure. As shown in FIG. 5, when the imaging lens and the curved reflector in the embodiments of the present disclosure satisfy the above conditions, desirable actual imaging effects are achieved, and the requirements from actual applications may be satisfied.

During optical design, the lens in the imaging lens 2 may further be the aspherical lens or the free-form lens, and the curved reflector 3 may further be the spherical mirror or the aspherical mirror. The embodiments of the disclosure are merely described by taking the above implementation solutions as examples, but do not limit specific surfaces of the imaging lens 2 and the curved reflector 3. During specific processing, the lens in the imaging lens 2 and the curved reflector 3 may be made of glass or resin, which is not limited herein.

While the preferred embodiments of the present disclosure have been described, additional alterations and modifications to those embodiments can be made by those skilled in the art once the basic inventive concept is apparent to those skilled in the art. Therefore, it is intended that the appended claims are to be interpreted to include the preferred embodiments and all alterations and modifications that fall within the scope of the present disclosure.

It will be apparent to those skilled in the art that various modifications and variations can be made to the disclosure without departing from the spirit and scope of the disclosure. Thus, it is intended that the disclosure cover such modifications and variations which come within the scope of the appended claims and their equivalents, as well.

What is claimed is:

1. A head up display system, comprising:
   a display screen used for displaying an image;
   an imaging lens arranged on a light emitting side of the display screen and used for imaging an image displayed on the display screen;
   a curved reflector arranged on a side of the imaging lens facing away from the display screen and used for receiving imaging light from the imaging lens and reflecting the light to positions of human eyes; wherein
   relative positions of the display screen and the imaging lens are fixed, and the imaging lens and the curved reflector adopt a split structure;
   a focal length of an optical system composed of the imaging lens and the curved reflector is 190 mm to 200 mm;
   a focal length of the imaging lens is greater than three times of the focal length of the optical system; and
   a focal length of the curved reflector is greater than two times of the focal length of the optical system.

2. The head up display system according to claim 1, wherein a distance between the display screen and the imaging lens is 4 mm to 5 mm, and a distance between the imaging lens and the curved reflector is 150 mm to 170 mm.

3. The head up display system according to claim 1, wherein the display screen is one of an organic light-emitting diode display screen, a micro organic light-emitting diode display screen, a liquid crystal display, a digital light processing projection system or a liquid crystal on silicon display screen.

4. The head up display system according to claim 1, wherein the imaging lens comprises at least one lens.

5. The head up display system according to claim 4, wherein lenses in the imaging lens are coaxially arranged.

6. The head up display system according to claim 5, wherein the lens is a spherical lens, an aspherical lens or a free-form lens.

7. The head up display system according to claim 6, wherein the imaging lens comprises:
   a first lens arranged on the light emitting side of the display screen; and
   a second lens arrange on a side of the first lens facing away from the display screen,
   wherein the first lens is a positive lens and the second lens is a negative lens.

8. The head up display system according to claim 7, wherein the first lens and the second lens are spherical lenses; and two optical surfaces of the first lens and two optical surfaces of the second lens each satisfies a following relation:

$$z = \frac{cr^2}{1 + \sqrt{1 - (1+k)c^2r^2}};$$

wherein z represents a surface equation of the optical surface, c represents a radius of curvature, k represents a conic coefficient, and r represents a semiaperture.

9. The head up display system according to claim 8, wherein
   an optical surface on a side of the first lens close to the display screen satisfies:
   k=0, and
   c=3.939848223043368×10$^2$; and
   an optical surface on a side of the first lens facing away from the display screen satisfies:
   k=0, and
   c=−6.967912313673151×10.

10. The head up display system according to claim 8, wherein
    an optical surface on a side of the second lens close to the first lens satisfies:
    k=0, and
    c=−4.096120177593520×10; and
    an optical surface on a side of the second lens facing away from the first lens satisfies:
    k=0, and
    c=−5.861444795965758×10.

11. The head up display system according to claim 1, wherein the curved reflector is a spherical mirror, an aspherical mirror or a free-form mirror.

12. The head up display system according to claim 11, wherein in a case that the curved reflector is the free-form mirror, two optical surfaces of the curved reflector are parallel to each other, and the two optical surfaces of the curved reflector each satisfies a following relation:

$$z = \frac{cr^2}{1 + \sqrt{1 - (1+k)c^2r^2}} + \sum_{i=1}^{N} A_i E_i(x, y);$$

wherein z represents a surface equation of the optical surface, c represents a radius of curvature, k represents a conic coefficient, r represents a semiaperture, $E_i(x,y)$ represents an extended polynomial, $A_i$ represents a coefficient of the extended polynomial, and N represents a total number of the coefficients of the polynomial.

13. The head up display system according to claim 12, wherein
    the optical surface of the curved reflector satisfies:
    k=−3.724720760726326×10, and
    c=−6.710907082649701×10$^2$;
    coefficients corresponding to the extended polynomial in the surface equation that the optical surface of the curved reflector satisfies are:
    a coefficient of a first term being 38, a coefficient of a second term being 134, a coefficient of a third term being 0, a coefficient of a fourth term being 0, a coefficient of a fifth term being −4.452481, a coefficient of a sixth term being 0, a coefficient of a seventh term being −2.902843, a coefficient of an eighth term being 0, a coefficient of a ninth term being 0.680583, a coefficient of a tenth term being 0, a coefficient of an eleventh term being 0.594765, a coefficient of a twelfth term being −13.143795, a coefficient of a thirteenth term being 0, a coefficient of a fourteenth term being −30.083025, a coefficient of a fifteenth term being 0, a coefficient of a sixteenth term being −13.251191, a coefficient of a seventeenth term being 0, a coefficient of an eighteenth term being 3.982513, a coefficient of a nineteenth term being 0, a coefficient of a twentieth term being 9.501150, a coefficient of a twenty-first term being 0, a coefficient of a twenty-second term being 8.733155, a coefficient of a twenty-third term being 5.925483, a coefficient of a twenty-fourth term being 0, a coefficient of a twenty-fifth term being 38.674995, a coefficient of a twenty-sixth term being 0, a coefficient of a twenty-seventh term being 34.654924, a coefficient of a twenty-eighth term being 0, a coefficient of a twenty-ninth term being 12.215770, a coefficient of a thirtieth term being 0, a coefficient of a thirty-first term being −5.009061, a coefficient of a thirty-second term being 0, a coefficient of a thirty-third term being −28.937871, a coefficient of a thirty-fourth term being 0, a coefficient of a thirty-fifth term being −46.733028, a coefficient of a thirty-sixth term being 0, a coefficient of a thirty-seventh term being −28.994059, a coefficient of a thirty-eighth term being −6.498547, a coefficient of a thirty-ninth term being 0 and a coefficient of a fortieth term being −35.932363.

14. The head up display system according to claim 11, wherein an included angle between a tangent plane of a center point of the curved reflector and a vertical direction is adjustable, and the included angle of the curved reflector is 7° to 11°.

* * * * *